(12) United States Patent
Wade et al.

(10) Patent No.: US 7,765,690 B2
(45) Date of Patent: Aug. 3, 2010

(54) PROCESS FOR FABRICATING ELECTRONIC COMPONENTS AND ELECTRONIC COMPONENTS OBTAINED BY THIS PROCESS

(75) Inventors: Travis Wade, Paris (FR); Jean-Eric Wegrowe, Noisy sur Ecole (FR)

(73) Assignee: Ecole Polytechnique DGAR, Palalseau Cedex (FR)

( * ) Notice: Subject to any disclaimer, the term of this patent is extended or adjusted under 35 U.S.C. 154(b) by 587 days.

(21) Appl. No.: 10/599,127

(22) PCT Filed: Mar. 21, 2005

(86) PCT No.: PCT/FR2005/000682
§ 371 (c)(1),
(2), (4) Date: May 23, 2007

(87) PCT Pub. No.: WO2005/098989
PCT Pub. Date: Oct. 20, 2005

(65) Prior Publication Data
US 2007/0281385 A1    Dec. 6, 2007

(30) Foreign Application Priority Data
Mar. 23, 2004    (FR) .................................. 04 02998

(51) Int. Cl.
*H05K 3/02*    (2006.01)
(52) U.S. Cl. .......................... 29/846; 29/892.1; 29/599; 29/601; 29/896.6; 977/890; 427/245; 205/112

(58) Field of Classification Search ................. 29/592.1, 29/599, 601, 896.6; 977/890; 427/245; 205/112
See application file for complete search history.

(56) References Cited

U.S. PATENT DOCUMENTS

| 4,687,551 A * | 8/1987 | Furneaux et al. .............. 205/50 |
| 5,259,957 A * | 11/1993 | Rosenfeld et al. ........... 210/490 |
| 6,325,909 B1 * | 12/2001 | Li et al. ...................... 205/106 |
| 6,740,910 B2 | 5/2004 | Roesner et al. |
| 2002/0130311 A1 * | 9/2002 | Lieber et al. ................... 257/1 |

(Continued)

FOREIGN PATENT DOCUMENTS

DE          100 36 897 C    1/2002

(Continued)

OTHER PUBLICATIONS

Y. C. Sui et al., "Synthesis of multi branched carbon nanotubes in porous anodic aluminum oxide template", Jul. 26, 2001, Carbon vol. 39, Issue 11, pp. 1709-1715.*

(Continued)

*Primary Examiner*—Derris H Banks
*Assistant Examiner*—Jeffrey Carley
(74) *Attorney, Agent, or Firm*—Miller, Matthias & Hull

(57) ABSTRACT

The invention relates to a method for producing electronic components consisting in carrying out a first anodization of a carrier material (1) for forming at least one first pore (3) extending in a first direction in said carrier material (1) and in carrying out a second anodization for forming at least one second pore (17) extending in the carrier material (1) in a second direction different from the first direction.

29 Claims, 8 Drawing Sheets

U.S. PATENT DOCUMENTS

2004/0149979 A1\* 8/2004 Cheong et al. .................. 257/9
2006/0292870 A1 12/2006 Pribat

FOREIGN PATENT DOCUMENTS

FR 2 860 780 A1 4/2005
WO WO 00/51186 A 8/2000

OTHER PUBLICATIONS

European Patent Office Office Action received in the corresponding European patent application; Office Action dated Dec. 20, 2007.
Yuldashev et al, "Growth of ZnO Nanowires by Electrochemical Deposition into Porous Alumina on Silicon Substrates," *Journal of the Korean Physical Society*, vol. 42, pp. S216-S218, Feb. 2003.
Izaki et al., "Room-temperature Ultravoliet Light-emitting Zinc Oxide Micropatterns Prepared by Low-temperature Electrodeposition and Photoresist," *Applied Physics Letters*, vol. 83, No. 24, pp. 4930-4932, Dec. 2003.
Lew et al, "Template-directed Vapor-Liquid-Solid-Growth of Silicon Nanowires," *J Vac Sci Technol*. B20(1), pp. 389-392, Jan./Feb. 2002.
Hoffer et al, Spin-dependent Magnetoresistance and Spin-charge Separation in Multiwall Carbon Nanotubes, *arXiv cond-mat/0303314v2 [cond-mat mes-hall]* pp. 1-4, Mar. 18, 2003.
Liu et al, "Self-assembly and Autopolymerization of Pyrrole and Characteristics of Electrodeposition of Polypyrrole on Roughened Au(111) Modified by Underpotentially Deposited Copper," *J. Phys. Chem*. B2003, 107, pp. 9802-9807, Aug. 15, 2003.
Schonenberger et al, "Template Synthesis of Nanowires in Porous Polycarbonate Membranes: Electrochemistry and Morphology," *J Phys. Chem B* 1997, 101, pp. 5497-5505, Mar. 24, 1997.
Hornyak et al, "Template Synthesis of Carbon Nanotubes," *Nanostructured Materials*, vol. 12, pp. 83-88, 1999.
International Search Report for International Application No. PCT/FR2005/000682, dated Jul. 5, 2005, 3 pages.
"Selective Growth of Carbon Nanotubes for Nanoscale Transistors",Won Bong Choi, et al., Advanced functional Materials, Wiley Intersciences, vol. 13, No. 1, Jan. 2003, pp. 80-84.
"Growth of Carbon Nantubes on Anodic Aluminum Oxide Templates: Fabrication of a Tube-in-Tube and Linearly Joined Tube", Jin Seung Lee et al., Chemistry of Materials American Chem. Soc., vol. 13, No. 7, Jul. 2001, pp. 2387-2391.
"Ultrahigh-Density Nanotransistors by Using Selectively Grown Vertical Carbon Nanotubes", Wong Bong Choi et al, Applied Physics Letters, American Institute of Physics, Nov. 2001, vol. 79, No. 22, pp. 3696-3698.
"Electrochemical Fabrication of Cadmium Chalcogenide Microdiode Arrays", Chemistry of Materials, Jul. 1993, vol. 5, No. 7, pp. 902-904.
"Coulomb Blockade in a Single Tunnel Junction Directly Connected to a Multiwalled Carbon Nanotube", Applied Physics Letters, American Institute of Physics, Oct. 2000, vol. 77, No. 18, pp. 2891-2893.

\* cited by examiner

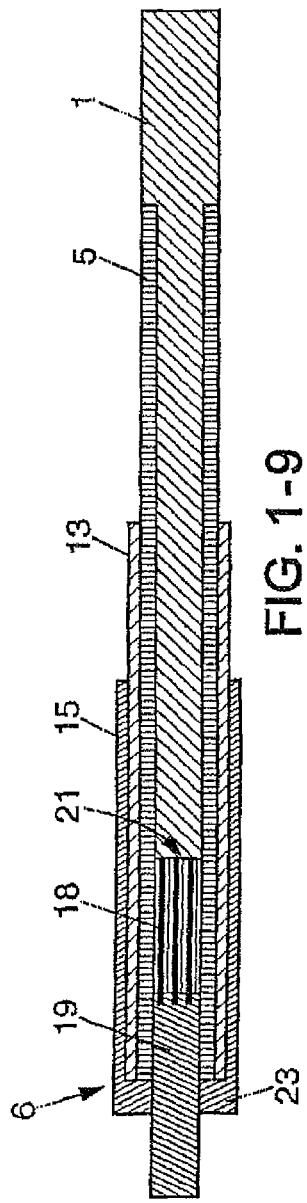
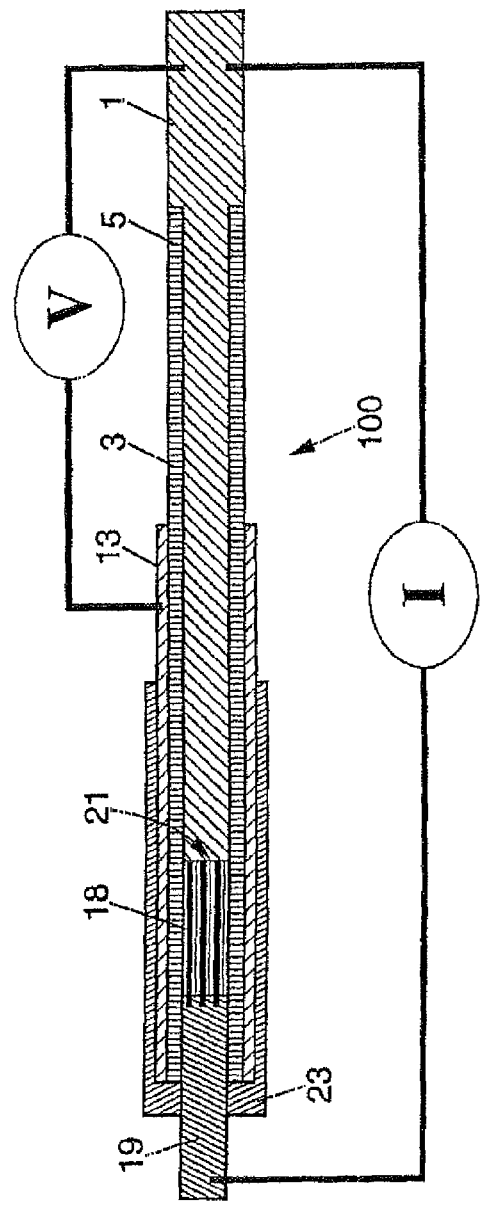

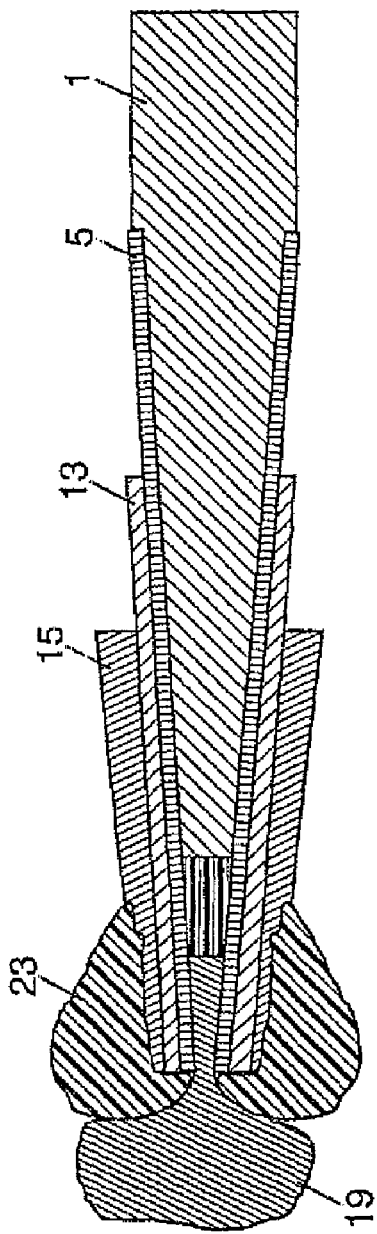
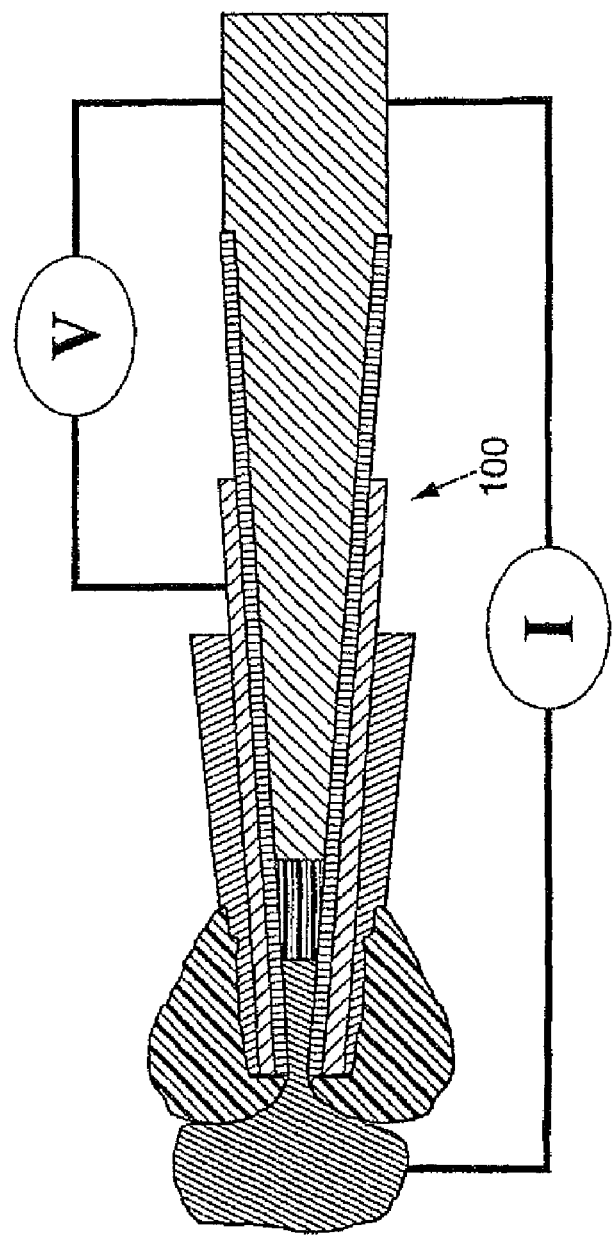
FIG. 3-11  FIG. 3-12

PROCESS FOR FABRICATING ELECTRONIC COMPONENTS AND ELECTRONIC COMPONENTS OBTAINED BY THIS PROCESS

CROSS REFERENCE TO RELATED APPLICATION

This is the U.S. National Phase of International Application No. PCT/FR2005/000682, filed 21 Mar. 2005, the entire disclosure of which is incorporated by reference.

FIELD OF THE DISCLOSURE

The invention relates to processes for producing electronic components and to the electronic components obtained by this process.

BACKGROUND OF THE DISCLOSURE

Patent application FR 03/11959 already discloses processes for fabricating electronic components, in which a first anodizing operation is carried out on a support material in order to form at least one first pore that extends, in this support material, along a first direction.

In these processes, an anodizing operation is carried out on a material in order to form, in the latter, pores suitable for accommodating an active material. For example, in document FR 03/11959, the active material is a carbon nanotube, the growth of which was constrained and oriented by the geometry of the pore in which this growth took place.

These processes are aimed at making it easier to integrate nanostructures into a standard microelectronic device (for example of the CMOS type).

As an alternative, the inventors have sought to use this type of nanofabrication process with a view to higher-level integration.

SUMMARY OF THE DISCLOSURE

Thus, according to one method of implementing the invention, a process is provided for fabricating electronic components in which, apart from the abovementioned features, a second anodizing operation is carried out in order to form at least one second pore that extends in the support material along a second direction, different from the first direction.

According to this method of implementing the invention, the pores may be used to grow and/or organize nanobricks.

Furthermore, pores oriented essentially along at least two different directions are obtained. This makes it easier to carry out separate treatments according to the various orientations of the pores. It is thus possible to ascribe different functions to the pores along each of these directions.

For example, the pore or pores extending along the first direction may be used to produce one function of the electronic component, for example the gate of a transistor, while the pore or pores extending along the second direction may be used to produce a second function of the component, for example the drain of a transistor.

According to other methods of implementing the invention, one or more of the following provisions may optionally be employed:

an insulating material is formed in the first pore, i.e. in a first anodized layer;

an active material is formed in the second pore, i.e. a second anodized layer. This active material is for example chosen from a semiconductor, a superconductor, a magnetic material and a carbon structure;

a semiconductor material is deposited in the second pore by electrodeposition. This semiconductor material is for example transparent to light. It may be an organic material, such as polypyrrole;

the support material constitutes both a self-supporting structure for a component and electrical contact means. It is thus possible, thanks to the invention, to obtain a rigid structure that can be handled autonomously, without the aid of a substrate such as those generally used in conventional microelectronics;

a transistor is produced, the source and drain contacts of which are each at one of the ends of the second pore, respectively, and a gate contact is produced by depositing a conducting material on the surface layer;

the support material is in the form of a portion of a wire, called hereafter a "support wire", extending longitudinally parallel to the second direction. This is a completely novel form which permits a three-dimensional approach to the preparation of electronic components. Thus, at least one degree of freedom is gained in the operations carried out for fabricating these components compared with what is imposed by the planar geometry of components on a substrate. Furthermore, the diameter of the support wire can be easily controlled, down to dimensions close to a few microns, by electropolishing;

a plurality of pores, including the first pore, are formed, each extending substantially over the thickness of a surface layer of the support wire, radially, i.e. perpendicular to the second direction. In other words, the first anodized layer is thus formed. This surface layer can then be converted into a suitable dielectric in order to constitute the gate of a transistor. For example, if the source and drain contacts are each located at one of the ends of the second pore respectively, a gate contact may be produced by depositing a conducting material on the surface layer;

at least one active element is enveloped in a matrix comprising the support material;

an electrically conducting material is deposited in at least one of the first and second pores;

an optically conducting material is deposited in at least one of the first and second pores;

a thermally conducting material is deposited in at least one of the first and second pores;

at least one line of a material chosen from an electrically conducting material, a thermally conducting material and an optically conducting material is produced on the surface of the support material, in order to connect the active element to an external element; and the process involves a number of treatment operations carried out on the support material, all of the same nature, for example it comprises at least three treatment steps in liquid medium, including the first anodizing operation, the second anodizing operation and an electrodeposition step.

These treatment steps may be implemented under relatively unrestrictive operating conditions. This has the advantage over conventional processes for fabricating microelectronic components of making it easier to implement the processes for fabricating these components. This is because the conventional processes involve a number of operations that are now well known to those skilled in the microelectronics art, such as thin-film deposition on a substrate, photolithography operations, microetching, etc. These operations require relatively complicated means, employed in clean rooms and using deposition and/or etching machines operating under ultrahigh vacuum. These processes are therefore relatively costly and are, and will continue to be, more costly as the size scale of the electronic components continues to decrease.

Furthermore, in certain methods of implementing the invention, in which the structuring of the component is essentially imposed by a "mold" or a "skeleton" formed by an organized or unorganized network of nanopores, it is possible to completely dispense with the use of lithography operations.

Compared to conventional fabrication processes for microelectronic components, these methods of implementing the invention have an economical advantage, as explained above, but also an advantage from the standpoint of the actual physics. This is because, to produce ever smaller components, the wavelengths involved pass from those used in optical lithography to those used in electron lithography. However, the means then employed cannot easily be made compatible with mass production. Now, using the methods of implementing the invention envisaged here, the structuring scales are essentially imposed by the chemistry and/or electrochemistry of the treatments carried out, which treatments act at the molecular level. This is therefore an alternative approach to the conventional processes, which consists in structuring electronic components from elementary nanobricks, such as atoms, aggregates, nanoparticles, nanotubes, nanorods, etc. This approach is called a "bottom-up" approach with respect to the scale of the elementary nanobricks.

Processes of the prior art using the "bottom-up" approach are known. For example, nanostructures are produced from elementary bricks using tips of atomic force or scanning tunneling microscopes, or by self-assembly in media of the sol-gel type, by electrodeposition, catalytic growth on a nanocatalyst, etc.

Certain methods of implementing the invention presented above aye similar, by analogy, to organization on the basis of a skeleton since, by its organizational structure, a skeleton imposes a functional assembly of the various elements of which it is composed and gives the assembly a rigid mechanical structure. Within the context of the invention, a rigid structure is also formed that imposes the organization or self-organization, during their growth, of elementary nanobricks, while still allowing, by its mechanical rigidity, subsequent handling. In particular, such structuring does not, however, have the drawbacks of nanostructuring using atomic-force or scanning-tunneling microscope tips, which does not seem at the present time to be compatible with a process for the mass production of electronic components.

Nor do the methods of implementing the invention have the drawbacks of the structuring techniques involving self-assembly, which experience difficulties due to the lack of reproducibility and to the handling of the objects formed by self-assembly. Furthermore, the connections of the self-assembled objects to conventional electronic circuits require the use of the abovementioned conventional microelectronic techniques, and therefore have the aforementioned drawbacks.

According to another aspect, the invention relates to an electronic component obtained by the abovementioned process.

According to one embodiment, this component comprises an element of support material with at least one first pore that extends along a first direction and at least one second pore that extends along a second direction, different from the first direction.

According to other embodiments, this component includes one or more of the following provisions:

the second pore is at least partly filled with an active material, chosen for example from a conductor, a semiconductor, a superconductor, a magnetic material and a carbon structure. This active material may be transparent to light, and in this case it is for example an organic material;

a first electrical contact is produced between the active material and the support material, on the bottom of the second pore;

the support material constitutes both a self-supporting structure for the component and electrical contact means;

the element of support material is in the form of a support wire portion that extends longitudinally parallel to the second direction. This support wire portion includes, at the second pore, a surface layer consisting of an electrically insulating material and a second electrical contact, radially external with respect to the surface layer, is produced on this surface layer; and the component includes at least one active element connected via the first and second pores to the surface of the support material.

Other aspects, objects and advantages of the invention will become apparent on reading the description of several of its exemplary embodiments and/or methods of implementation.

BRIEF DESCRIPTION OF THE DRAWINGS

The invention will also be more clearly understood with the aid of the drawings, in which.

DETAILED DESCRIPTION OF THE DISCLOSURE

Figure 1:
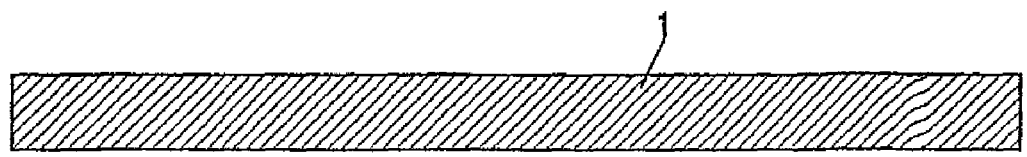
FIG. 1 shows schematically the evolution of a component during various production steps of an exemplary method of implementing the process according to the invention.

A first exemplary method of implementing the process according to the invention is presented below in relation to FIGS. 1 and 2.

According to this exemplary method of implementation, the process essentially comprises ten steps, each illustrated by FIGS. 1-1 to 1-10 respectively.

The process example presented below is applied to the production of a transistor from a support material 1 consisting of an aluminum wire. This aluminum wire is for example a wire 12 microns in diameter, which is commercially available without any difficulty. A portion a few centimeters in length is obtained from this wire. Optionally, the diameter of this wire portion is adjusted by electropolishing down to less than 1 micron. As an example, the electropolishing is carried out by applying a voltage of +8 volts between the support wire, which is connected to a first electrode 7, and a second electrode 9, as illustrated in FIG. 2. This FIG. 2 shows the support material 1 connected to the first electrode 7. The constituent wire of the support material is placed substantially at the center of and perpendicular to the plane of a loop forming the second electrode 9. The whole assembly, consisting of the support material and the first 7 and second 9 electrodes, is immersed in an electrolyte bath, which is uniformly mixed by a stirrer 11. For the electropolishing, the electrolyte consists of a 25% hydrochloric acid (70% $HClO_4$)/75% ethanol mixture. Under these conditions, the rate of dissolution of the aluminum is approximately 1.5 microns per second.

According to a variant, a +20 volts voltage is applied for 10 minutes in an electrolyte consisting of sulfuric acid (70% $H_2SO_4$). The rate of anodizing is then about 50 nm/min.

Figures 1, 2:
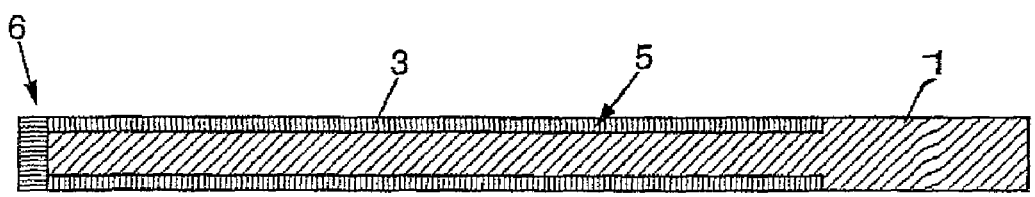
FIG. 2 shows schematically an example of equipment employed during the anodization steps of the process shown in FIG. 1.

As shown in FIG. 1-2, the support material 1 is then anodized in order to form a first network of pores 3 extending essentially radially over the thickness of a surface layer 5.

This radial anodizing step employs the arrangement illustrated in FIG. 2. A voltage of +40 volts is applied for 2 to 3 minutes between the first 7 and second 9 electrodes. The electrolyte consists of 0.3 molar oxalic acid. Under these conditions a rate of anodizing of about 200 nm/min is obtained.

After this anodizing step, that part of the support material 1 immersed in the electrolyte has a surface layer 5 about 400 nanometers in thickness consisting of alumina $Al_2O_3$. Except fox the end 6 of the immersed part of the support material 1, the pores of the first network 3 are oriented essentially perpendicular to the longitudinal axis of the wire.

Figures 1, 2, 3:
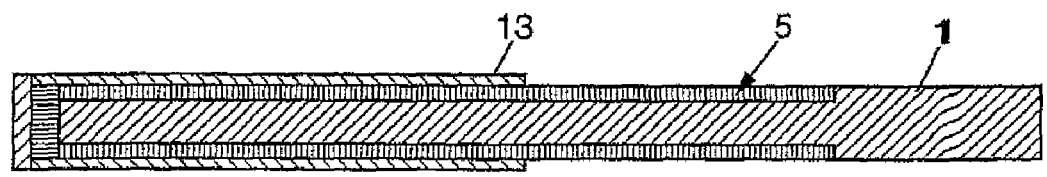
FIG. 3 shows schematically the evolution of a component during various production steps of another exemplary method of implementing the process according to the invention.

As shown in FIG. 1-3, part of the anodized end of the support material 1 is coated, by cathode sputtering, with a gold film 13. This gold film 13 is about 18 nanometers in thickness. It is intended to form a gate contact for the transistor being fabricated.

As shown in FIG. 1-4, an insulator film 15 is applied to the gold film 13. This insulator film 15 is for example a film of varnish. It is intended to protect, at least electrically, the radial part of the surface layer 5 and the gold film 13 during the subsequent steps.

As shown in FIG. 1-5, the end 6 is cut off, beyond that part of the surface layer 5 formed at the end tip of the support material 1. Thus, the aluminum is again bare at each longitudinal end of the support material 1.

As shown in FIG. 1-6, the support substrate 1 then undergoes an electropolishing step. To give an example, this electropolishing step is carried out with an arrangement like that shown in FIG. 2, under the following conditions: voltage between the first 7 and second 9 electrodes: +8 volts; electrolyte consisting of a 25% hydrochloric acid (70% $HClO_4$)/75% ethanol mixture; for 10 seconds. Under these conditions, about 15 microns of aluminum are dissolved at the end 16.

As shown in FIG. 1-7, the support substrate 1 then undergoes a second anodizing operation. To give an example, this second anodizing operation is carried out with an arrangement like that illustrated in FIG. 2, under the following conditions: +40 volts voltage between the first 7 and second 9 electrodes, for 10 to 20 minutes, in an electrolyte consisting of 0.3 molar oxalic acid. Under these conditions, a rate of anodizing of about 200 nanometers per minute is obtained. During this second anodizing operation, a second network 17 of pores is formed. Given that the part immersed in the anodizing electrolyte solution is protected by the insulator film 15, except at the tip electropolished in the preceding step, the pores of the second network 17 are oriented essentially parallel to the longitudinal axis of the support material 1.

The internal diameter of these pores may be controlled. For example, it will be possible to obtain pores with an internal diameter between 10 and 50 nanometers, depending on the experimental conditions. Likewise, their length may be controlled, for example between a few nanometers and a few tens of microns.

As shown in FIG. 1-8, an active material 18 is formed in the pores of the second network 17. This active material may for example be a semiconductor, a superconductor, a magnetic material or a carbon structure. Several examples of active material 18 are given below, with their respective conditions for electrodepositing them in the pores of the second network 17.

Production of Gold Nanowires:
voltage between the first 7 and second 9 electrodes: 0 volts relative to an Ag/AgCl reference electrode (not shown in FIG. 2);
electrolyte: 4 grams per liter of AuCl and 100 grams per liter of NaCl.

Production of Nickel Nanowires:
voltage between the first 7 and second 9 electrodes: −1 volt relative to an Ag/AgCl reference electrode (not shown in FIG. 2);
electrolyte: 120 grams per liter of $NiSO_4$ and 30 grams per liter of $H_3BO_3$.
Each pore of the second network 17 then comprises a nickel nanowire 10 to 50 nanometers in diameter and 0.4 to 50 microns in length.

Production of Copper Nanowires:
voltage between the first 7 and second 9 electrodes: −0.3 volts relative to an Ag/AgCl reference electrode (not shown in FIG. 2);
electrolyte: 30 grams per liter of $CuSO_4$ and 30 grams per liter of $H_3BO_3$.

Production of Cobalt Nanowires:
voltage between the first 7 and second 9 electrodes: −1 volt relative to an Ag/AgCl reference electrode (not shown in FIG. 2);
electrolyte: 120 grams per liter of $CoSO_4$.

Production of Copper Oxide ($Cu_2O$) Nanowires:
voltage between the first 7 and second 9 electrodes: −0.3 volts relative to an Ag/AgCl reference electrode (not shown in FIG. 2);
electrolyte: 5 grams per liter of $CuSO_4$ and 70 grams per liter of pyrophosphate, pH=11.

Production of Selenium Nanowires:
voltage between the first 7 and second 9 electrodes: −0.7 volts relative to an Ag/AgCl reference electrode (not shown in FIG. 2);
electrolyte: 5 grams per liter of $SeO_2$ and sulfuric acid (10% $H_2SO_4$).

Production of Tellurium Nanowires:
voltage between the first 7 and second 9 electrodes: −0.7 volts relative to an Ag/AgCl reference electrode (not shown in FIG. 2);
electrolyte: 2 grams per liter of $TeO_2$ and sulfuric acid (10% $H_2SO_4$).

Production of Zinc Oxide Nanowires:
voltage between the first 7 and second 9 electrodes: −0.45 volts relative to an Ag/AgCl reference electrode (not shown in FIG. 2);
electrolyte: 0.03 molar $ZnNO_3$.

Production of Polypyrrole Nanowires:
voltage between the first 7 and second 9 electrodes: +0.85 volts relative to an Ag/AgCl reference electrode (not shown in FIG. 2);
electrolyte: 0.1 molar pyrrole and 0.1 molar $LiClO_4$.

As shown in FIG. 1-9, an insulator 23, similar to the insulator 15, is deposited on the end 6. A contact 19 is then electrodeposited at the end 6 of the support material 1. For example, this contact is made of copper. To give an example, the copper electrodeposition conditions may be the following:

voltage between the first 7 and second 9 electrodes: −0.3 volts, in an electrolyte consisting of 30 grams per liter of $CuSO_4$ buffered with 30 grams per liter of $H_3BO_3$ having a pH of 3.6.

The nickel nanowires of the active material 18 then constitute the drain of a transistor 100 (see FIG. 1-10). These nanowires are in electrical contact with the aluminum of the support material 1 at an interface 21.

A gate voltage may then be measured, between the support material 1 and the gold film 13 constituting the gate electrode, while a current is being applied on either side of the drain, between the contact 19 and the rest of the support material 1, at the interface 21.

According to variants, the active material 18 consists of:
- a transparent semiconductor obtained by the process described in "*Growth of ZnO nanowires by electrochemical deposition into porous alumina on silicon substrates*" by S. U. Yuldashev, S. W. Choi, T. W. Kang and L. A. Nosova, Journal of the Korean Physical Society 42, S216-218, Suppl. February 2003; or "*Room-temperature ultraviolet light-emitting zinc oxide micropatterns prepared by low-temperature electrodeposition and photoresist*", by M. Izaki, S. Watase and H. Takahashi, Applied Physics Letters 83(24), pp 4930-4932, Dec. 15, 2003;
- silicon nanowires obtained by the process described in "*Template-directed vapor-liquid-solid growth of silicon nanowires*" by K. K. Lew, C. Reuther, A. H. Carim, J. M. Redwing and B. R. Martin, Journal of Vacuum Science and Technology 20(1), pp 389-392, January 2002;
- diodes obtained using the growth process described in "*Electrochemical fabrication of cadmium chalcogenide microdiode arrays*" by J. D. Klen, R. D. Herrick, D. Palmer, M. J. Sailor, C. J. Brumlik and C. R. Martin, Chemistry of Materials 5(7), pp 902-904, July 1993;
- carbon nanotubes produced using the growth process described in "*Coulomb blockade in a single tunnel junction directly connected to a multiwalled carbon nanotube*" by J. Haruyama, I. Takesue and Y. Sato, Appl. Phys. Lett. 77, 2000, p. 2891 or in "*Spin dependent magnetoresistance and spin-charge separation in multiwall carbon nanotubes*" by X. Hoffer, Ch. Klinke, J-M. Bonard and J-E. Wegrowe, Cond. Mat./0303314; and
- an organic semiconductor obtained by the process described in "*Self-assembly and autopolymerization of pyrrol and characteristics of electrodeposition of polypyrrole on roughened Au (111) modified by underpotentially deposited copper*" by Y-C. Liu and T. C. Chuang, Journal of Physical Chemistry B 104, pp 9802-9807, 2003.

Another inspiration for the deposition of metal nanowires in the pores of the second network 17 may be the growth process described in "*Template synthesis of nanowires in porous polycarbonate membranes: electrochemistry and morphology*" by C. Schonenberger, B. M. I. Vanderzande, L. G. J. Fokkink, M. Henny, C. Schmid, M. Kruger, A. Bachtold, R. Huber, H. Birk and U. Stoufer, Journal of Physical Chemistry B 101 (28), pp 5497-5505, 10 Jul. 1997.

Numerous variants may be envisaged in the electrodeposition or solution deposition of the active material 18. Carbon nanotubes may be deposited by chemical vapor deposition, at 600° C. and under 20 millibars of acetylene. Silicon nanowires may be deposited by vapor deposition at 500° C., using $SiH_4$, under 0.65 torr, etc.

In a second exemplary method of implementing the process according to the invention shown in FIGS. 3-1 to 3-12, a process essentially similar to that described in relation to FIGS. 1-1 to 1-10 is employed, except for the electropolishing first step. This is because, during this electropolishing first step, a support wire 120 microns in diameter is tapered down so as to obtain a tip with a diameter of less than 5 microns.

This method of implementation illustrates the possibilities of integrating electronic components afforded by the process according to the invention.

The various steps of the process corresponding to FIGS. 3-2 to 3-9 correspond to those illustrated by FIGS. 1-1 to 1-8, respectively.

As shown in FIG. 3-10, an insulator 23 is deposited on the end 6.

As shown in FIG. 3-11, a contact 19 is then electrodeposited on the end 6 of the support material 1 (FIG. 3-11 and the corresponding step are similar to FIG. 1-9 and the step that it illustrates).

The arrangement shown in FIG. 3-12 is similar to that in FIG. 1-10.

Figures 1, 2, 3, 4:
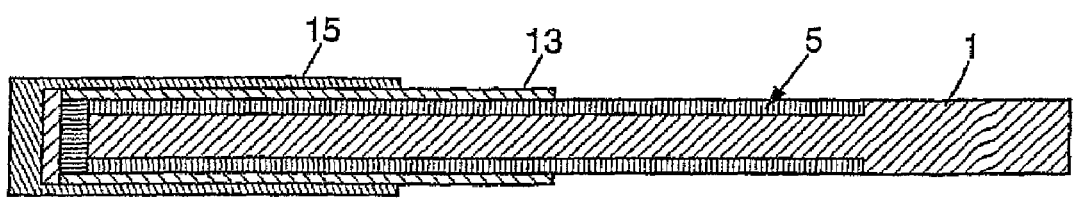
FIG. 4 shows schematically another exemplary embodiment of a component according to the present invention.
Figures 1, 2, 3, 4, 5:
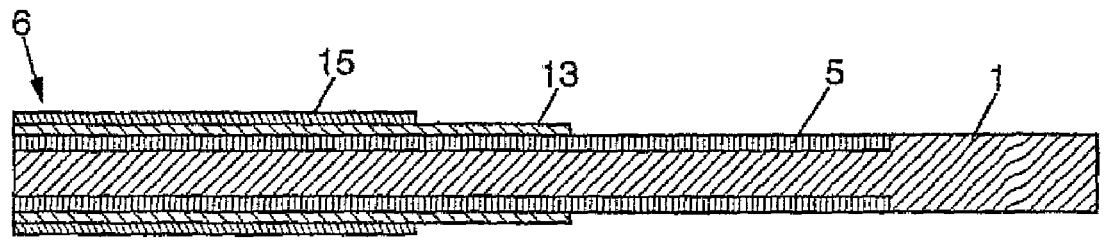
Figures 1, 2, 3, 4, 5, 6:
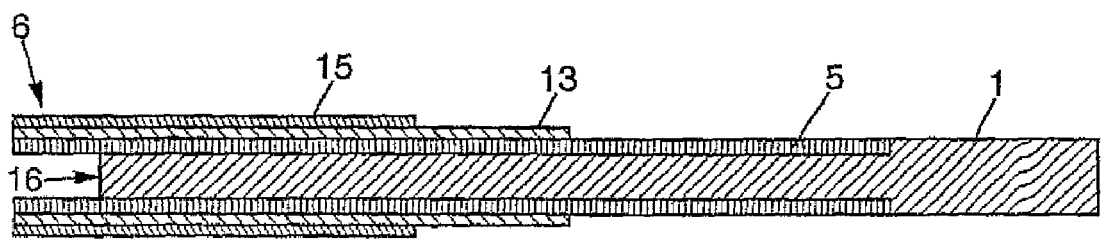
Figures 1, 2, 3, 4, 5, 6, 7:
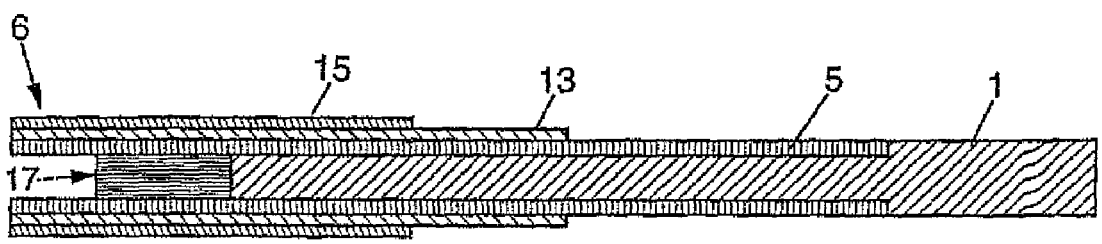
Figures 1, 2, 3, 4, 5, 6, 7, 8:
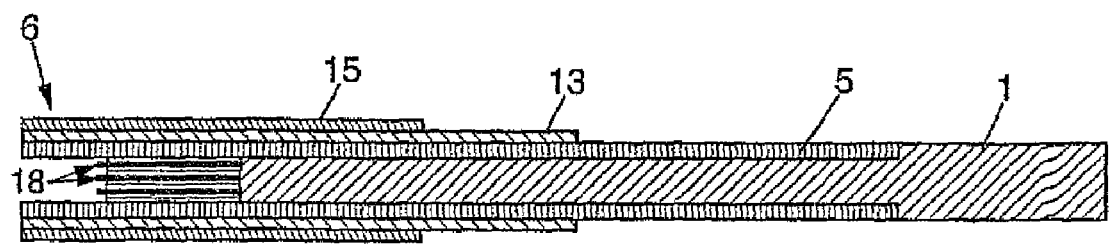
Figure 2:
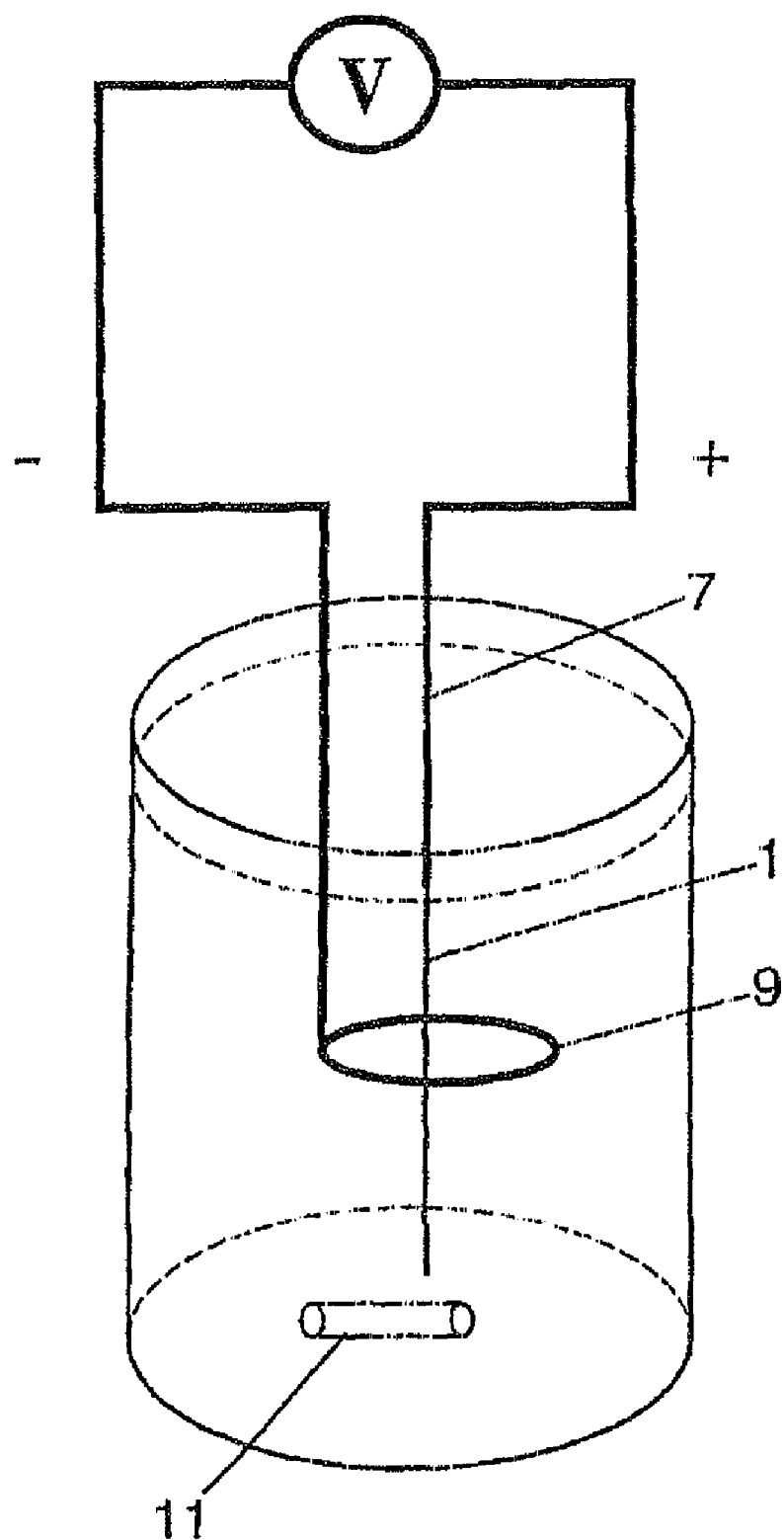
Figures 1, 3:
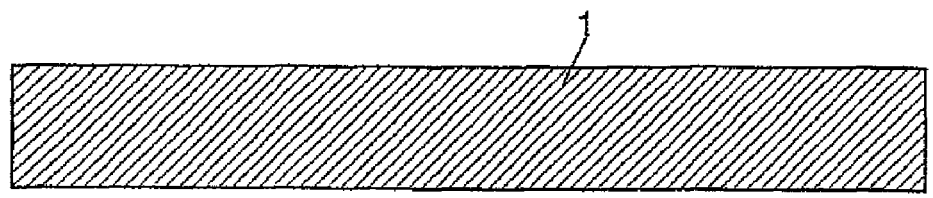
Figures 2, 3:
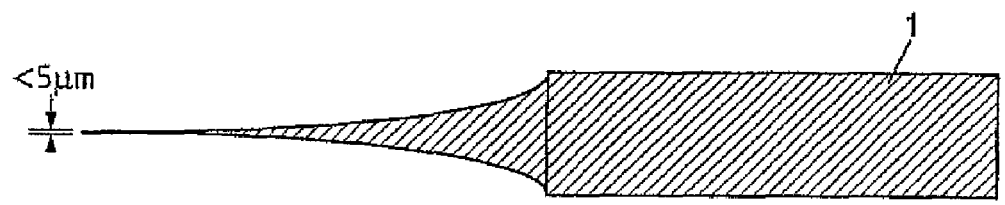
Figure 3:
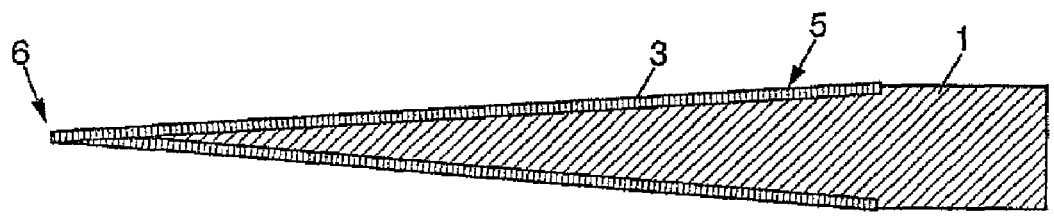
Figures 3, 4:
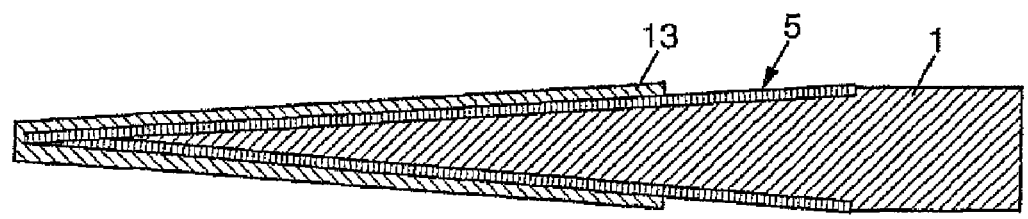
Figures 3, 4, 5:
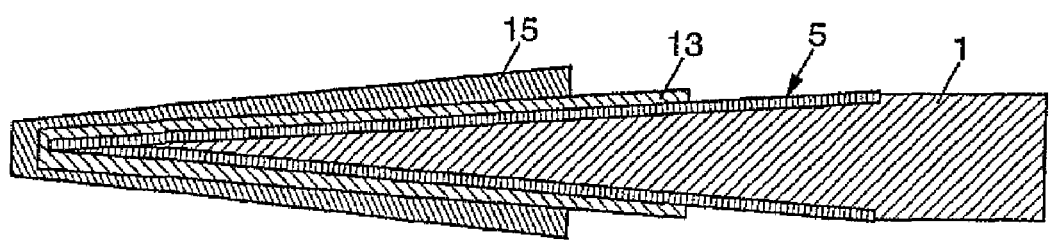
Figures 3, 4, 5, 6:
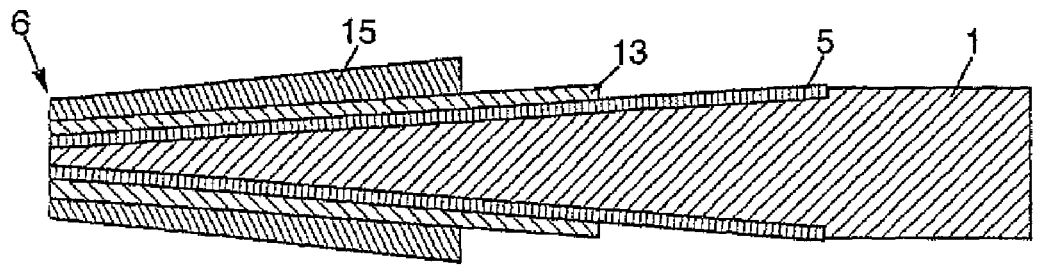
Figures 3, 4, 5, 6, 7:
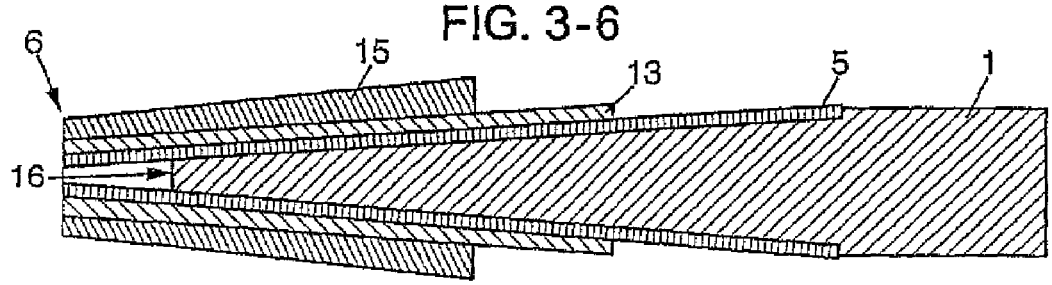
Figures 3, 4, 5, 6, 7, 8:
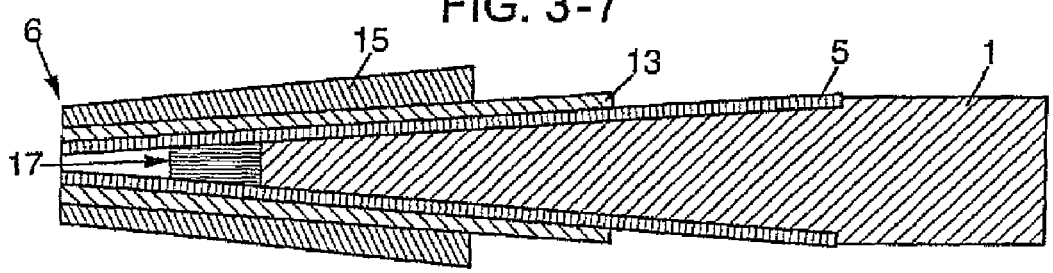
Figures 3, 4, 5, 6, 7, 8, 9:
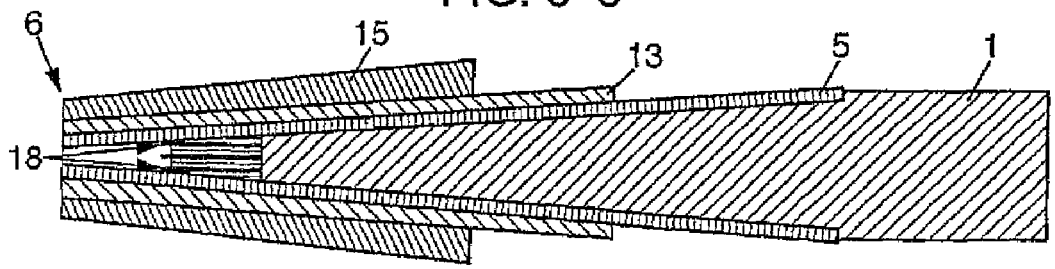
Figures 3, 4, 5, 6, 7, 8, 9, 10:
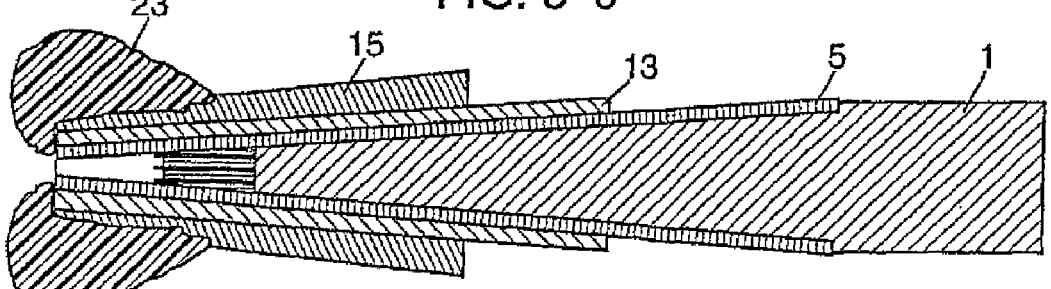
Figure 4:
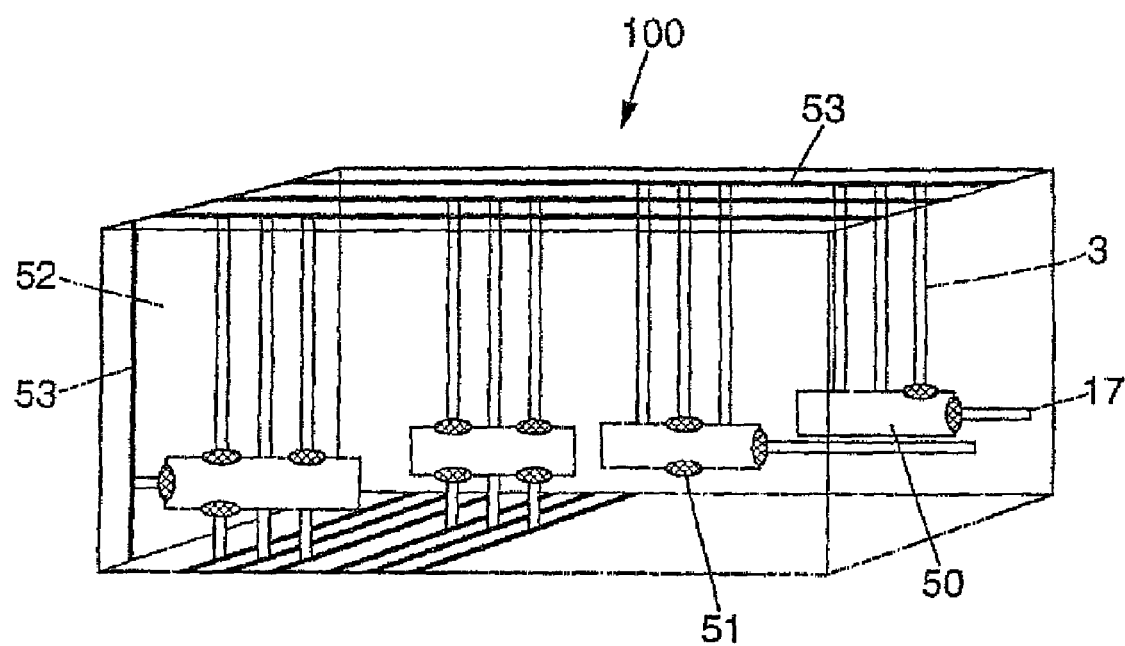

Another exemplary embodiment of a component 100 according to the present invention is shown in FIG. 4. This component 100 comprises active elements 50. These active elements 50 are nanoelectronic elements. They include nanoscale terminations 51 for electrically and/or thermally and/or optically connecting them to a macroscopic interface.

According to one exemplary method of implementing the process according to the invention, these active elements 50 are integrated into a matrix 52 at least partly formed from a support material 1. This support material 1 is for example aluminum. The active elements 50 are prepositioned on a receiving structure (not shown) before being enveloped by the support material 1.

A mask (not shown) is then produced on the faces of the matrix 52, for example using known photolithography techniques.

The matrix 52 is then anodized, for example using one of the ways indicated in relation to the above methods of implementation. Thus, at least two anodizing operations are carried out in order to form pores in the first and second directions respectively. These pores 17 make it possible to reach the nanoscale terminations 51.

An active material 18 is then deposited, for example by electrodeposition, in the pores 3, 17. The choice of the value of the electrolytic potential and its orientation, during this electrodeposition step, allows the active material 18 to be selectively deposited in certain pores 3, 17, for example those actually joining a nanoscale termination 51.

The ends of the pores 3, 17, which emerge on the surface of the matrix 52, are optionally connected by means of tracks 53 intended for a connection to a macroscopic interface. These tracks 53 themselves may be produced on the surface of the matrix 52 on a larger scale than that of the nanoscale terminations 51. In particular, they may be submicroscale or microscale tracks produced by optical lithography processes known to those skilled in the art.

Tracks 53 may be produced on all the faces of the component 100. Some of these tracks 53 may be dedicated to thermal conduction and thermal coupling, while others may be dedicated to electrical conduction and electrical connection and/or while yet others may be dedicated to optical conduction and optical connection. For example, certain tracks allow an active element, such as a transistor of a memory unit, to be electrically contacted by its "world lines" and/or "read lines", while this same active element 50 may be thermally coupled to a heat bath. If the active element 50 is a Peltier element, this may be connected to a battery. Optical sensors may also be placed directly on the surface of the matrix 52.

In this way, it is possible to remove the heat generated by an active element 50 or, on the contrary, to produce an electric current from temperature differences.

The invention claimed is:

1. A process for fabricating electronic components, in which a support material is provided, which comprises a first and a second surface; a first anodizing operation is carried out along a first direction on the first surface of said support material in order to form at least one first pore that extends, in this support material, along the first direction, further comprising a second anodizing operation carried out along a second direction on the second surface in order to form on the second surface at least one second pore that extends in the support material along said second direction, different from the first direction.

2. The process as claimed in claim 1, wherein an insulating material is formed in the first pore.

3. The process as claimed in claim 1, wherein an active material is formed in the second pore.

4. The process as claimed in claim 3, wherein the active material is chosen from a conductor, a semiconductor, a superconductor, a magnetic material and a carbon structure.

5. The process as claimed in claim 3, wherein the active material is deposited in the second pore by electrodeposition.

6. The process as claimed in claim 5, wherein the active material is a semiconductor material transparent to light.

7. The process as claimed in claim 6, wherein the semiconductor material is an organic material.

8. The process as claimed in claim 1, wherein the support material constitutes both a self-supporting structure for a components and electrical contact means.

9. The process as claimed in claim 1, wherein a transistor is produced, the source and drain contacts of which are each at one of the ends of the second pore, respectively, and a gate contact is produced by depositing a conducting material on the surface layer.

10. The process as claimed in claim 1, wherein the support material is in the form of a portion of a wire extending longitudinally parallel to the second direction.

11. The process as claimed in the claim 10, wherein a plurality of pores, including the first pore, are formed, each extending substantially over the thickness of a surface layer of the wire, radically perpendicular to the second direction.

12. The process as claimed in claim 11, wherein the surface layer of the wire constitutes a layer of dielectric.

13. The process as claimed in claim 1, wherein at least one active element is enveloped in a matrix comprising the support material.

14. The process as claimed in claim 13, wherein an electrically conducting material is deposited in at least one of the first and second pores.

15. The process as claimed in claim 13, wherein a thermally conducting material is deposited in at least one of the first and second pores.

16. The process as claimed in claim 13, wherein an optically conducting material is deposited in at least one of the first and second pores.

17. The process as claimed in claim 13, wherein at least one line of a material chosen from an electrically conducting material, a thermally conducting material and an optically conducting material is produced on the surface of the support material, in order to connect the active element to an external element.

18. The process as claimed in claim 1, wherein at least three treatment steps take place in a liquid medium, including the first anodizing operation, the second anodizing operation and an electrodeposition step.

19. An electronic component obtained by a process in which a support material is provided, which comprises a first and a second surface; a first anodizing operation is carried out along a first direction on the first surface of said support material in order to form at least one first pore that extends, in this support material, along the first direction; a second anodizing operation is carried out along a second direction on the second surface in order to form on the second surface at least one second pore that extends in the support material along said second direction, different from the first direction, the electronic component thereby comprising an element of support material with at least one first pore that extends from the first surface along said first direction and at least one second pore that extends from the second surface along said second direction, different from the first direction.

20. The component as claimed in claim 19, wherein the second pore is at least partly filled with an active material.

21. The component as claimed in claim 20, wherein the active material is chosen from a conductor, a semiconductor, a superconductor, a magnetic material and a carbon structure.

22. The component as claimed in claim 20, wherein the active material is transparent to light.

23. The component as claimed in claim 20, wherein the active material is an organic material.

24. The component as claimed in claim 20, wherein a first electrical contact is produced between the active material and the support material, on the bottom of the second pore.

25. The component as claimed in claim 19, wherein the support material constitutes both a self-supporting structure for the component and electrical contact means.

26. The component as claimed in claim 19, wherein the element of support material is in the form of a wire portion that extends longitudinally parallel to the second direction.

27. The component as claimed in claim 26, wherein the wire portion includes, at the second pore, a surface layer consisting of an electrically insulating material.

28. The component as claimed in claim 27, wherein a second electrical contact, radically external with respect to the surface layer, is produced on this surface layer.

29. The component as claimed in claim 19, further including at least one active element connected via the first and second pores to the surface of the support material.

* * * * *